United States Patent
Yang et al.

(10) Patent No.: US 8,178,975 B2
(45) Date of Patent: May 15, 2012

(54) SEMICONDUCTOR PACKAGE WITH PAD PARTS ELECTRICALLY CONNECTED TO BONDING PADS THROUGH RE-DISTRIBUTION LAYERS

(75) Inventors: Seung Taek Yang, Seoul (KR); Shin Young Park, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/916,907

(22) Filed: Nov. 1, 2010

(65) Prior Publication Data

US 2011/0042809 A1   Feb. 24, 2011

Related U.S. Application Data

(62) Division of application No. 11/856,266, filed on Sep. 17, 2007, now Pat. No. 7,847,419.

(30) Foreign Application Priority Data

Aug. 20, 2007   (KR) .................. 10-2007-0083429

(51) Int. Cl.
  *H01L 23/48* (2006.01)
  *H01L 23/52* (2006.01)
(52) U.S. Cl. ............... 257/773; 257/786; 257/E23.02
(58) Field of Classification Search .......... 257/773, 257/786, E23.02
  See application file for complete search history.

(56) References Cited

U.S. PATENT DOCUMENTS

| | | | |
|---|---|---|---|
| 5,677,576 A | 10/1997 | Akagawa | |
| 6,221,751 B1 | 4/2001 | Chen et al. | |
| 6,396,148 B1 * | 5/2002 | Eichelberger et al. | 257/758 |
| 6,472,745 B1 * | 10/2002 | Iizuka | 257/723 |
| 6,894,386 B2 | 5/2005 | Poo et al. | |
| 7,115,984 B2 | 10/2006 | Poo et al. | |
| 7,547,630 B2 | 6/2009 | Gerber | |
| 7,576,436 B2 | 8/2009 | Hung | |
| 7,579,681 B2 * | 8/2009 | Chia et al. | 257/685 |
| 2004/0124523 A1 | 7/2004 | Poo et al. | |
| 2005/0048695 A1 * | 3/2005 | Chia et al. | 438/106 |
| 2005/0104228 A1 | 5/2005 | Rigg et al. | |
| 2007/0152327 A1 * | 7/2007 | Chia et al. | 257/723 |
| 2007/0187814 A1 | 8/2007 | Cusack et al. | |

FOREIGN PATENT DOCUMENTS

CN         1246731 A        3/2000
(Continued)

OTHER PUBLICATIONS

USPTO OA mailed Jan. 26, 2010 in connection with U.S. Appl. No. 11/856,266.

(Continued)

*Primary Examiner* — Nitin Parekh
(74) *Attorney, Agent, or Firm* — Ladas & Parry LLP

(57) ABSTRACT

The semiconductor package includes: a semiconductor chip module having multiple adjacently arranged or integrally formed semiconductor chips each with a bonding pad group and a connection member electrically connecting each of the bonding pads included in the first bonding pad group to the corresponding bonding pad in the second bonding pad group. In the present invention pad parts can be formed on the outside of the semiconductor chip module to conform with the standards of JEDEC. These pad parts are then connected to the semiconductor chips bonding pads through re-distribution layers. The pad parts of the semiconductor package can then conform to the JEDEC standards even while having a semiconductor chip with bonding pads smaller than the standards.

9 Claims, 8 Drawing Sheets

FOREIGN PATENT DOCUMENTS

| | | |
|---|---|---|
| CN | 1574345 A | 2/2005 |
| JP | 01-235264 A | 9/1989 |
| JP | 08-330-356 A | 12/1996 |
| JP | 2000-332423 A | 11/2000 |
| JP | 2001-223319 A | 8/2001 |
| JP | 2003-273313 A | 9/2003 |
| JP | 2004-048048 A | 2/2004 |
| JP | 2004-253805 A | 9/2004 |
| JP | 2006-157068 A | 6/2006 |
| JP | 2007-201519 A | 8/2007 |
| KR | 20030029680 A | 4/2003 |
| KR | 1020070037826 A | 4/2007 |

OTHER PUBLICATIONS

USPTO OA mailed Apr. 29, 2010 in connection with U.S. Appl. No. 11/856,266.

USPTO NOA mailed Aug. 5, 2010 in connection with U.S. Appl. No. 11/856,266.

* cited by examiner

SEMICONDUCTOR PACKAGE WITH PAD PARTS ELECTRICALLY CONNECTED TO BONDING PADS THROUGH RE-DISTRIBUTION LAYERS

CROSS-REFERENCE TO RELATED APPLICATIONS

The present application claims priority to Korean patent application number 10-2007-83429 filed on Aug. 20, 2007, which is incorporated herein by reference in its entirety.

BACKGROUND OF THE INVENTION

The present invention relates to a semiconductor package.

Due to recent development, a semiconductor package including a semiconductor device that stores enormous amounts of data and processes the stored data in a short time.

Generally, a semiconductor package is manufactured by means of a semiconductor chip manufacturing process that forms a semiconductor chip by integrating devices, such as a transistor, resistor, capacitor, etc., on a wafer, and by means of a package process that both electrically connects a semiconductor chip to an external circuit board, etc., by separating it from the wafer and protects the brittle semiconductor chip from impact and/or vibration applied by an outside source.

Recently, a wafer level package whose size is only about 100% to 105% of the size of the semiconductor chip has been developed While the size of the semiconductor package continues to be gradually reduced, the semiconductor package requires functions capable of storing and processing even more data For example, a semiconductor package may require a large number of input/output terminals in order to store more data and/or process more data. This large number of input/output terminals becomes a problem when reducing the size of the semiconductor package, because as the size of the semiconductor package is reduced, it becomes difficult to secure an area for forming the required input/output terminals.

Recently, a semiconductor chip and semiconductor package smaller than the standard for a semiconductor package as defined by the Joint Electron Device Engineering Council, JEDEC, etc. was developed. This reduction in size was made possible by a technical development in the semiconductor chip manufacturing process. However, when the size of the semiconductor chip and the semiconductor package is smaller than the defined standard of JEDEC, it is difficult to apply the semiconductor package to electronic equipment that relied on JEDEC's standard.

BRIEF SUMMARY OF THE INVENTION

A semiconductor package according to the present invention may comprise: a semiconductor chip module having at least two semiconductor chips integrally formed, each including bonding pads; and a re-distribution layer having pad parts arranged on the semiconductor chip module and connection parts electrically connecting the respective pad parts to the bonding pads.

The semiconductor chips of the semiconductor package are arranged in an m×n matrix form, where m is 1 or more, n is 2 or more, and n and m are natural numbers).

The pad parts of the semiconductor package are arranged regularly on the semiconductor chip module.

The connection parts of the semiconductor package electrically connect the bonding pads of a semiconductor chip to corresponding bonding pads on a different semiconductor chips.

The semiconductor package may further comprise: a first insulation layer pattern covering the upper surface of the semiconductor chip module and having openings that expose each of the bonding pads; and a second insulation layer pattern formed on the first insulation layer to cover the connection parts and having openings that expose the pad parts.

In another embodiment, the semiconductor chip module of the semiconductor package has through electrodes that extend from the upper surface of the semiconductor chip module to the lower surface of the semiconductor chip module and penetrate each of the bonding pads. The re-distribution layer is formed on the lower surface of the semiconductor chip module and is connected to the bonding pads using the through electrodes.

The semiconductor package further comprises: a first insulation layer pattern formed over the lower surface and with openings exposing the through electrodes; and a second insulation layer pattern formed over the first insulation layer to cover the re-distribution layer and having openings that expose a plurality of pad parts.

In another embodiment, a semiconductor package according to the present invention may comprise: a semiconductor chip module having a first semiconductor chip and a second semiconductor chip arranged adjacently to each other; a first bonding pad group having a plurality of bonding pads formed in the first semiconductor chip, and a second bonding pad group having a plurality of bonding pads formed in the second semiconductor chip; and a connection member electrically connecting each of the bonding pads included in the first bonding pad group the corresponding bonding pad included in the second bonding pad group, and also connecting the each bonding pad of the first and second is bonding pad groups to a corresponding pad part.

The first semiconductor chip and the second semiconductor chip of the semiconductor package are integrally formed.

The first and second bonding pad groups of the semiconductor package are arranged on the first and second semiconductor chips in the same shape.

The connection member of the semiconductor package may comprise: first re-distribution layers each connected to a the respective bonding pad included in the first bonding pad group and a respective bonding pad included in the second bonding pad group; a first insulation layer formed over the semiconductor chip module to cover the first re-distribution layers and having openings exposing portions of the first re-distribution layers; second re-distribution layers arranged on the first insulation layer and electrically connected to the corresponding first re-distribution layer; a second insulation layer formed over the first insulation layer to cover the second re-distribution layers; and pad parts connected to the second re-distribution layers through the holes formed in the second insulation layer.

The pads of the semiconductor package are arranged regularly on the second insulation layer.

The second re-distribution layers of the semiconductor package may intersect the first re-distribution layers.

Solder balls are formed over the pad parts and electrically connected to pad parts.

In another embodiment, a semiconductor package according to the present invention may comprise: a semiconductor chip module including a first semiconductor chip and a second semiconductor chip arranged adjacently, a first bonding pad group having a plurality of bonding pads formed in the first semiconductor chip and a second bonding pad group having a plurality of bonding pads formed in the second semiconductor chip; a re-distribution layer structure including: a first insulation member formed on the semiconductor chip module and having openings that expose each bonding pad in the first and second bonding pad groups, first re-distribution layers arranged on the first insulation member and electrically connecting the corresponding bonding pads in the first and second bonding pad groups, a second insulation member formed over the first insulation layer to cover the first re-distribution layers and having opening exposing portions of the first re-distribution layers, second re-distribution layers arranged on the second insulation member and electrically connected to the first re-distribution layers through the holes, a third insulation member formed over the second insulation layer to cover the second re-distribution layers, and pad parts connected to the second re-distribution layers; and an attachment member attaching the re-distribution layer structure to the semiconductor chip module.

The first semiconductor chip and the second semiconductor chip of the semiconductor package may be integrally formed.

Alternatively, the first semiconductor chip and the second is semiconductor chip of the semiconductor package may be separated from each other, with the separated first and second semiconductor chips being adjacently arranged to each other.

The bonding pads of the first semiconductor chip are arranged in the same position as that of the bonding pads in the second semiconductor chip.

A conductive connection member may be interposed between the first re-distribution layers and the corresponding first and second bonding pads of the re-distribution layer structure.

The conductive connection member of the semiconductor package may be an anisotropic conductive film including a conductive ball and resin.

Alternatively, the conductive connection member of the semiconductor package may include solder.

Solder ball are formed over the pad parts, and the solder balls are electrically connected to the pad parts.

The first to third insulation members of the semiconductor package includes synthetic resin and have a sheet form.

DESCRIPTION OF SPECIFIC EMBODIMENTS

Figure 1:
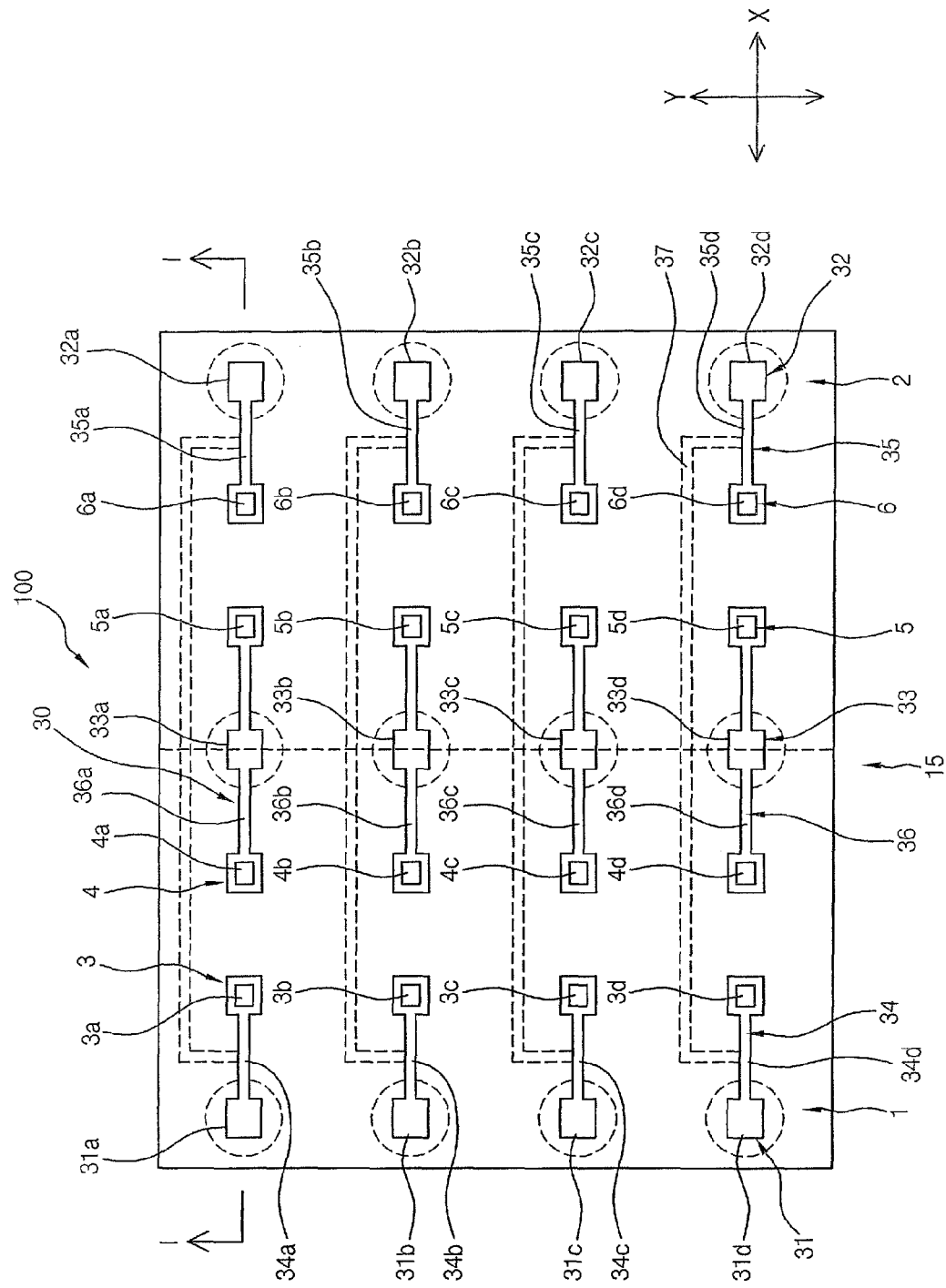
FIG. 1 is a plan view showing a semiconductor package according to a first embodiment of the present invention.
Figure 2:
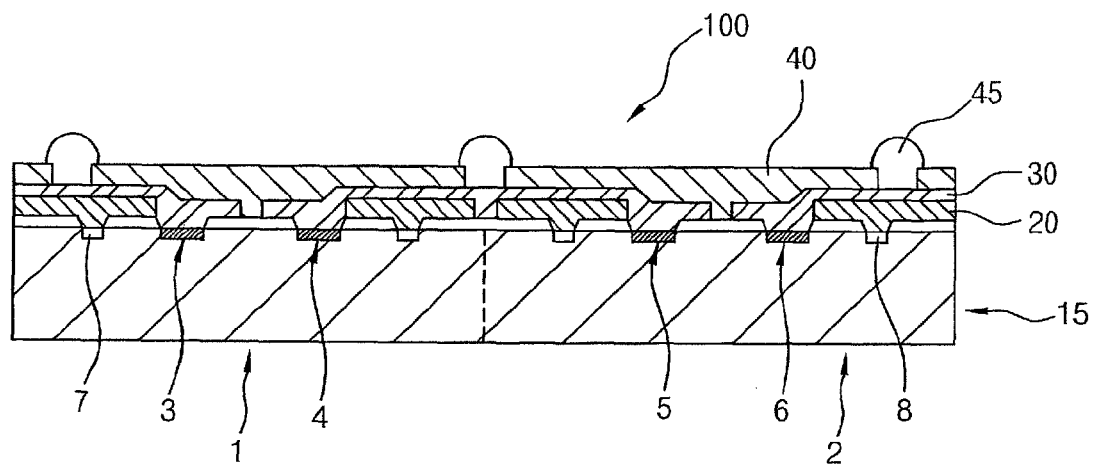
FIG. 2 is a cross sectional view taken along line of I-I' FIG. 1.

FIG. 1 is a plan view showing a semiconductor package according to a first embodiment of the present invention. FIG. 2 is a cross sectional view taken along line I-I' of FIG. 1.

Referring to FIGS. 1 and 2, the semiconductor package 100 includes a semiconductor chip module 15 and a re-distribution layer 30. Furthermore, the semiconductor package 100 includes a first insulation layer 20 and a second insulation layer 40.

The semiconductor chip module 15 includes at least two semiconductor chips. In the present embodiment, the semiconductor chips are arranged in an m×n matrix, with m being 2 or more, n being 1 is or more, and m and n being natural numbers).

In the present embodiment shown in FIGS. 1 and 2, a first semiconductor chip 1 and a second semiconductor chip 2 are arranged in 2×1 matrix form. The semiconductor chips 1 and 2 may be integrally formed.

The first semiconductor chip 1 includes a first bonding pad group 3, including bonding pads 3a, 3b, 3c, 3d, and a second bonding pad group 4, including bonding pads 4a, 4b, 4c, 4d The bond groups 3 and 4 are formed in two columns along the Y-axis direction shown in FIG. 1. Furthermore, the first semiconductor chip 1 may include a data storage (not shown) for storing data, a data processor (not shown) for processing the data, and a fuse box 7, all shown in FIG. 2.

Each bonding pad of the first and second bonding pad groups 3 and 4 is electrically connected to the data storage and/or the data processor of the second semiconductor chip.

The fuse box 7 includes a plurality of fuses (not shown) for repairing the data storage of the first semiconductor chip 1.

The second semiconductor chip 2 includes a third bonding pad group 5 including bonding pads 5a, 5b, 5c, 5d and fourth bonding pad group 6 including bonding pads 6a, 6b, 6c, 6d. The bonding pads are formed in two columns along the Y-axis direction shown in FIG. 1. Furthermore, the second semiconductor chip 2 may include a data storage (not shown) for storing data, a data processor (not shown) for processing the data, and a fuse box 8.

Each of the third and fourth bonding pad groups 5 and 6 is electrically connected to the data storage and/or the data processor of the second semiconductor chip 2.

In the present embodiment, the third bonding pad group 5 of the second semiconductor chip 2 is arranged adjacently to the second bonding pad group 4 of the first semiconductor chip 1. The same signal is applied to the adjacent bonding pads of the second bonding pad group 4 and the third bonding pad group 5, and the same signal is output from the adjacent bonding pads of the second bonding pad group 4 and the third bonding pad group 5.

The fuse box 8 includes a plurality of fuses (not shown) for repairing the data storage of the second semiconductor chip 2.

The first insulation layer pattern 20 is formed on the upper surface of the semiconductor chip module 15 having the first and second semiconductor chips 1 and 2. The first insulation layer pattern 20 may be an organic layer including organic matter. The first insulation layer pattern 20 covers the fuse boxes 7 and 8 of the first and second semiconductor chips 1 and 2 and has openings exposing each bonding pad in the first, second, third, and fourth bonding pad groups 3, 4, 5, and 6 of the first and second semiconductor chips 1 and 2.

The re-distribution layer 30 is formed on the first insulation layer pattern 20. The re-distribution layer 30 includes pad part groups 31, 32, and 33 and connection part groups 34, 35, and 36.

The pad part groups 31, 32, and 33 are arranged on the first insulation layer pattern 20 in a position meeting the standard defined by the Joint Electron Device Engineering Council (JEDEC), etc. For example, the pad parts 31, 32, and 33 are regularly arranged on the first insulation layer pattern 20.

Hereinafter, the pad parts arranged on the outside of the first bonding pad 3 of the first semiconductor chip 1 are defined as first pad parts 31a, 31b, 31c, 31d. The pad parts arranged at the outside of the fourth bonding pad 6 of the second semiconductor chip 2 are defined as second pad parts 32a, 32b, 32c, 32d. The pad parts arranged at the boundary portions of the first and second semiconductor chips 1 and 2 are defined as third pad parts 33a, 33b, 33c, 33d.

To further clarify, the first pad parts 31a, 31b, 31c, and 31d are arranged at the outside of the first bonding pads 3a, 3b, 3c, and 3d. The second pad parts 32a, 32b, 32c, and 32d are arranged at the outside of the fourth bonding pads 6a, 6b, 6c, and 6d. The third pad parts 33a, 33b, 33c, and 33d are interposed between the second bonding pads 4a, 4b, 4c, and 4d and the third bonding pads 5a, 5b, 5c, and 5d.

The connection part groups 34, 35, and 36 are arranged on the first insulation layer pattern 20.

In the present embodiment, the connection parts that electrically connect the respective first pad part group 31 to the respective first bonding pad group 3 of the first semiconductor chip 1 are defined as first connection parts 34a, 34b, 34c, 34d; 34. The connection parts electrically connecting the respective second pad part group 32 to the respective first bonding pad group 6 of the second semiconductor chip 2 are defined as second connection parts 35a, 35b, 35c, 35d; 35. The connection parts electrically connecting the respective second bonding pad group 4 of the first semiconductor chip 1 to the respective third bonding pad group 5 of the second semiconductor chip 2 are defined as third connection parts 36a, 36b, 36c, 36d; 36.

As previously noted, the respective second bonding pad group 4 of the first semiconductor chip 1 and the respective third bonding pad group 5 of the second semiconductor chip 2 are electrically connected by the third connection parts 36. Additionally, the first connection parts 34 and the second connection parts 35 may also be electrically connected by a further connection part group 37 shown by a dotted line. When the first bonding pad group 3 and the fourth bonding pad group 6 are electrically connected by the further connection part group 37, the same signal is input to the connected first and the fourth bonding pad groups 3 and 6, and the same signal is output from the connected first and fourth bonding pad groups 3 and 6.

The second insulation layer pattern 40 is formed over the first insulation layer pattern 30 to cover the re-distribution layer 30. The second insulation layer pattern 40 has openings exposing each pad part in the pad part groups 31, 32, and 33 of the re-distribution layer 30. The second insulation layer pattern 40 may include, for example, organic matter.

A conductive ball, such as a solder ball, may be formed over each pad part in the pad part groups 31, 32, and 33 exposed by the opening of the second insulation layer pattern 40.

Figure 3:
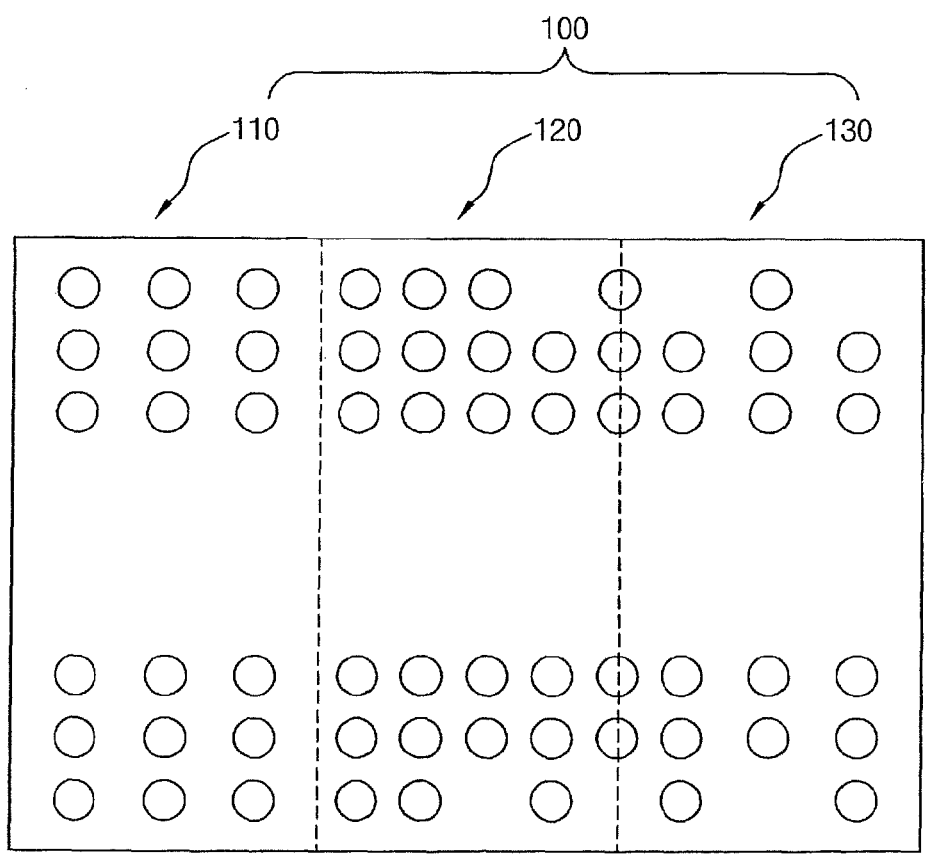
FIGS. 3 and 4 are plan views showing semiconductor packages according to another embodiment of the present invention.
Figure 4:
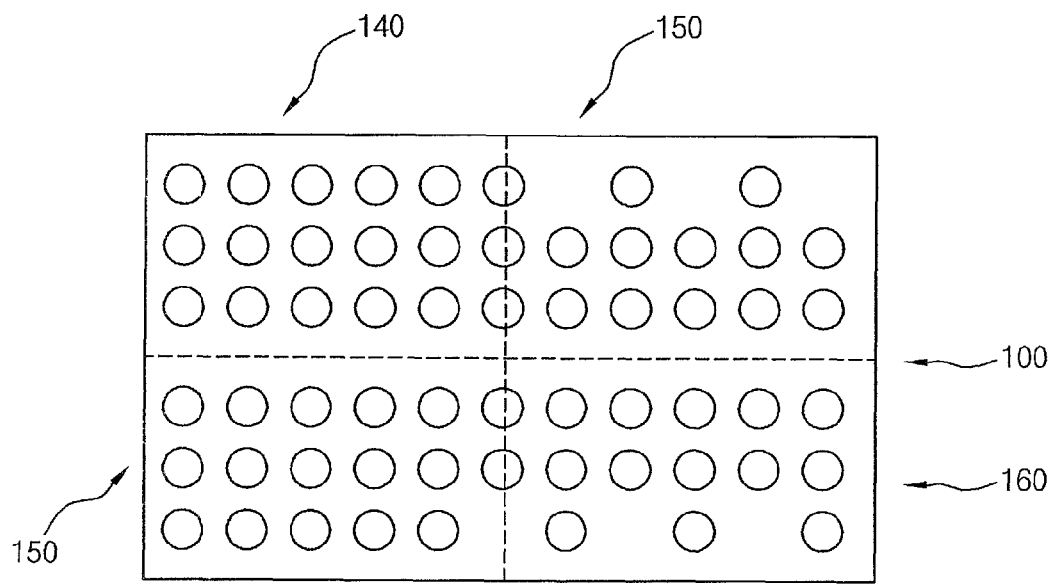

The present embodiment previously shown and described contained two semiconductor chips integrally formed in a 2×1 matrix. FIG. 3 shows an example of a semiconductor package 100 with three semiconductor chips 110, 120, and 130 arranged in 3×1 matrix form, and FIG. 4 is an example of a semiconductor package with four semiconductor chips 140, 150, 160, and 170 arranged in 2×2 matrix form.

Figure 5:
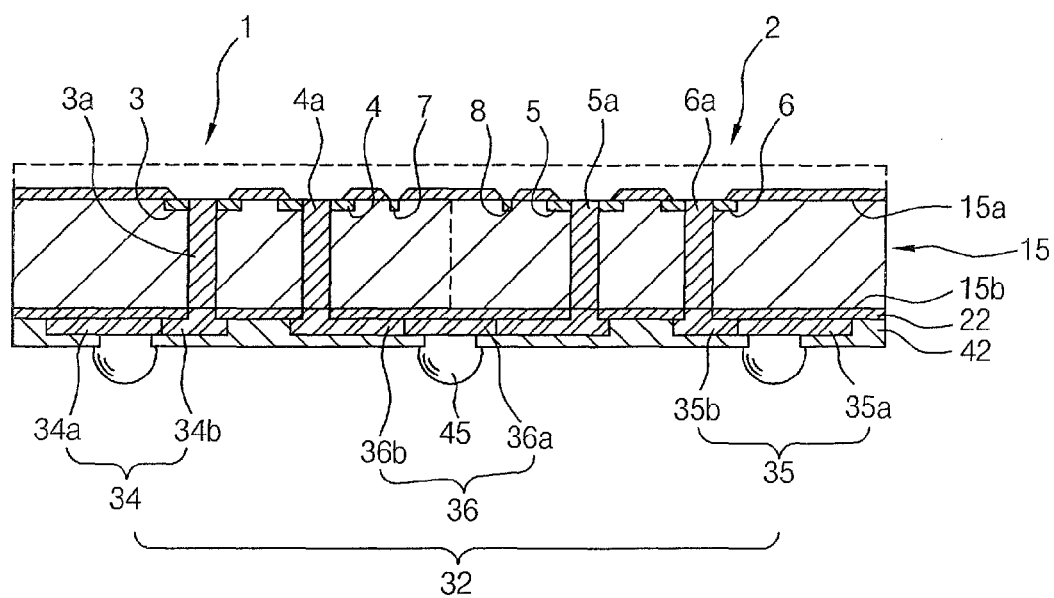
FIG. 5 is a cross-sectional view showing a semiconductor package according to a second embodiment of the present invention.

FIG. 5 is a cross-sectional view showing a semiconductor package according to a second embodiment of the present invention.

Referring to FIG. 5, a semiconductor package 100 includes: a semiconductor chip module 15; through electrodes 3a, 4a, 5a, and 6a; and a re-distribution layer 32.

Furthermore, the semiconductor package 100 includes a first insulation layer pattern 22 and a second insulation layer pattern 42.

The semiconductor chip module 15 includes at least two semiconductor chips. The semiconductor chips are arranged in an m×n matrix form with m being 2 or more, n being 1 or more, and m and n being natural numbers. The semiconductor chip module 15 has a rectangular shape with an upper surface 15a on which bonding pads are formed and a lower surface 15b facing the upper surface 15a.

In the present embodiment as shown in FIG. 5, two integrally formed semiconductor chips 1 and 2 are arranged in 2×1 matrix form. Hereinafter, the two integrally formed semiconductor chips are defined as a first semiconductor chip 1 and a second semiconductor chip 2. In the embodiment as shown in FIG. 5 the surface 15a has bonding pads 3, 4, 5, and 6.

The first semiconductor chip 1 includes a first bonding pad 3 and a second bonding pad 4 that is adjacently arranged to the first bonding pad 3. Furthermore, the first semiconductor chip 1 may include a data storage (not shown) for storing data and a data processor (not shown) for processing the data. The first bonding pad 3 and second bonding pad 4 of the first semiconductor chip 1 are electrically connected to the data storage and/or the data processor. Additionally, the first semiconductor chip 1 may include a plurality of fuses (not shown) for repairing the data storage.

The second semiconductor chip 2 includes a third bonding pad 5 and a fourth bonding pad 6. Furthermore, the second semiconductor chip 2 may include a data storage (not shown) for storing data and a data processor (not shown) for processing the data. The third and fourth bonding pads 5 and 6 of the second semiconductor chip 2 are electrically connected to the data storage and/or the data processor.

In the present embodiment, the third bonding pad 5 of the second semiconductor chip 2 is adjacently arranged to the second bonding pad 4 of the first semiconductor chip 1. The same signal is input to the second bonding pad 4 and the third bonding pad 5, and the same signal is output from the second bonding pad 4 and the third bonding pad 5. The second semiconductor chip 2 may include a plurality of fuses (not shown) for repairing the data storage.

Through electrodes 3a, 4a, 5a, and 6a penetrate the upper surface 15a and lower surface 15b of the semiconductor chip module 15 corresponding to the first to fourth bonding pads 3, 4, 5, and 6. Additionally, the through electrodes 3a, 4a, 5a, and 6a penetrate the corresponding first to fourth bonding pad 3, 4, 5, and 6.

Hereinafter, the through electrodes penetrating the upper surface 15a, the corresponding first and second bonding pad 3 and 4, and lower surface 15b are defined as a first through electrode 3a and a second through electrode 4a.

Additionally, the through electrodes penetrating the upper surface 15a, the corresponding third and fourth bonding pads 5 and 6, and the lower surface 15 bare defined as a third through electrode 5a and a fourth through electrode 6a.

In the present embodiment, the same signal may be input to the second and third through electrodes 4a and 5a, and the same signal may be output from the second and third through electrodes 4a and 5a. Furthermore, the same signal may be input to the first and fourth through electrodes 3a and 6a, and the same signal may be output from the first and fourth through electrodes 3a and 6a.

The first insulation layer pattern 22 is formed on the upper surface 15a and lower surface 15b of the semiconductor chip module 15. The first insulation layer pattern 22 may be, for example, an organic layer including organic matter, and the first insulation layer pattern 22 has openings exposing the first, second, third, and fourth through electrodes 3a, 4a, 5a, and 6a.

The re-distribution layer 32 is formed on the first insulation layer pattern 22 formed on the lower surface 15b of the semiconductor chip module 15. The re-distribution layer 32 includes a first re-distribution layer 34, a second re-distribution layer 35, and a third re-distribution 36.

The first re-distribution layer 34 is arranged on the first insulation layer pattern 22, and the first re-distribution layer 34 includes a first pad part 34a and a first connection part 34b. The first connection part 34b is electrically connected to the first through electrode 3a, and the first pad part 34a is formed integrally with the first connection part 34b.

The second re-distribution layer 35 is arranged on the first insulation layer pattern 22, and the second re-distribution layer 35 includes a second pad part 35a and a second connection part 35b. The second connection part 35b is electrically connected to the fourth through electrode 6a, and the second pad part 35a is integrally formed with the second connection part 35b.

The third re-distribution layer 36 is arranged on the first insulation layer pattern 22, and the third re-distribution layer 36 includes a third pad part 36a and a third connection part 36b. The third connection part 36b is electrically connected to the second and third through electrode 4a and 5a, and the third pad part 36a is formed integrally with the third connection part 36b.

In the present embodiment, the first, second, and third pad parts 34a, 35a, and 36a of the first, second, and third re-distribution layers 34, 35, and 36 are arranged at a position meeting the standard defined by the Joint Electron Device Engineering Council (JEDEC). The first, second, and third pad parts 34a, 35a, and 36a are regularly arranged on the first insulation layer pattern 22.

The second insulation layer pattern 42 is formed on the first insulation layer pattern 22 to cover the pad parts and the connection parts. The second insulation layer pattern 42 has an opening exposing a portion of the first, second, and third pad parts 34a, 35a, and 36a.

A conductive ball, such as a solder ball, can be formed in the opening exposing the first, second, and third pad parts 34a, 35a, and 36a.

The present embodiment as shown in FIG. 5 contains two integrally formed semiconductor chips. Additional examples include three semiconductor chips arranged in 3×1 matrix form and four semiconductor chips arranged in 2×2 matrix form.

As described above, when the size of the semiconductor chip is excessively small making it difficult to form the pad part, solder ball, etc. according to the standards of JEDEC, the pad parts meeting a prevision of JEDEC may be formed on the upper surfaces of the integrally formed semiconductor chips. The pad parts are electrically connected to the bonding pads of the respective semiconductor chips. It is then possible to have improved data storing ability and data processing ability while conforming to the standards of JEDEC.

Figure 6:
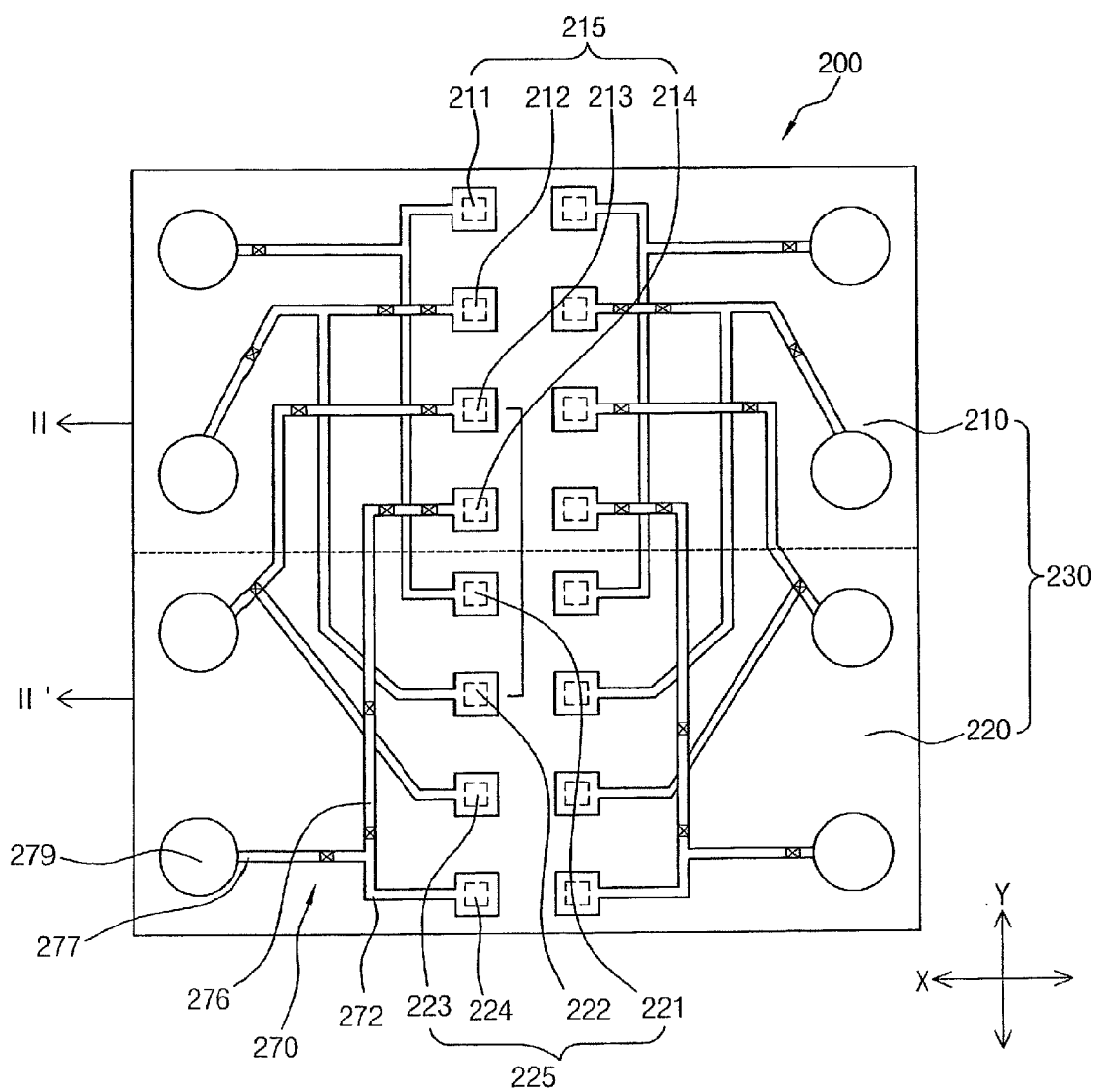
FIG. 6 is a cross-sectional view showing a semiconductor package according to a third embodiment of the present invention.
Figure 7:
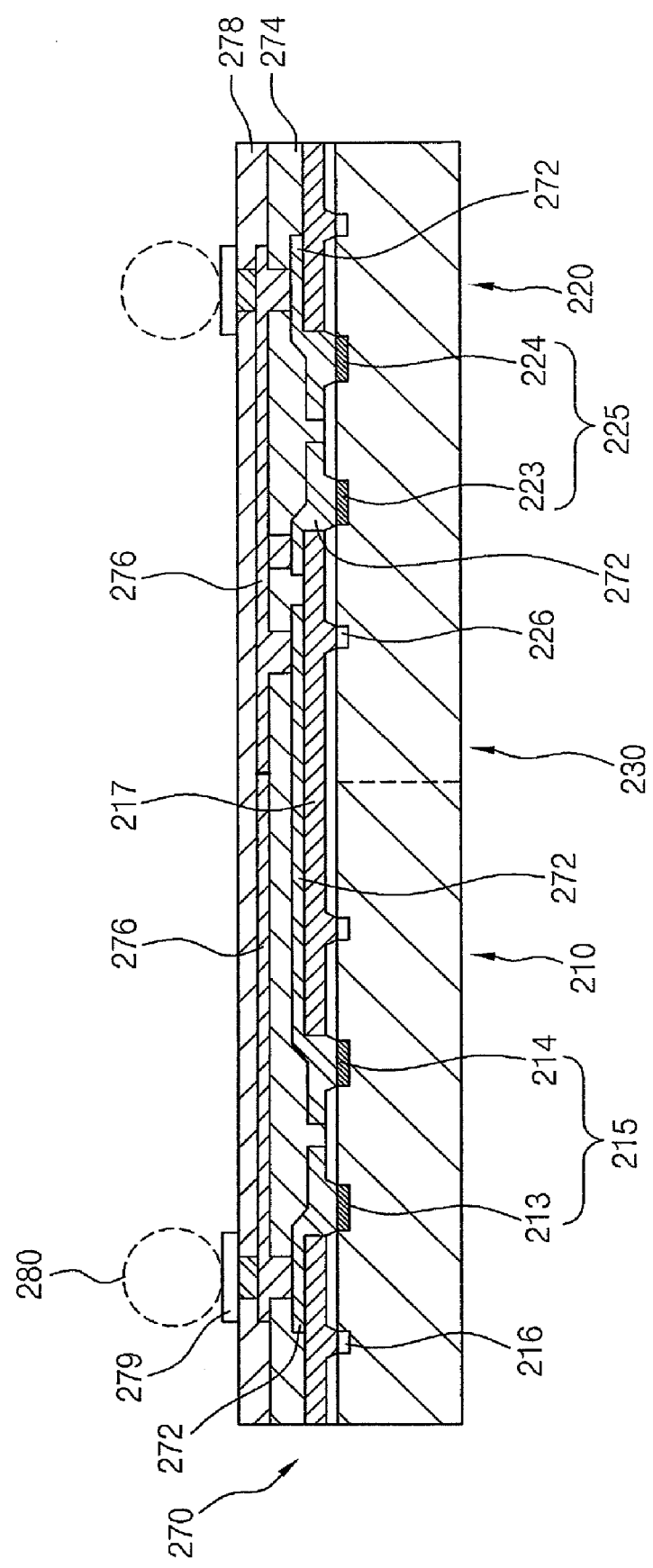
FIG. 7 is a cross sectional view taken along line II-II' of FIG. 6.

FIG. 6 is a cross-sectional view showing a semiconductor package according to a third embodiment of the present invention. FIG. 7 is a cross sectional view taken along line I-I' of FIG. 6.

Referring to FIGS. 6 and 7, a semiconductor package 200 includes a semiconductor chip module 230 and a connection member 270.

The semiconductor chip module 230 includes a plurality of semiconductor chips that may be formed integrally. The semiconductor chips of the semiconductor chip module 230 may be arranged in an m×n matrix form with m being 1 or more, n being 2 or more, and with m and n being natural numbers. In the present embodiment as shown in FIG. 6, the two semiconductor chips of the semiconductor chip module 230 are integrally formed. The semiconductor chips of the semiconductor chip module 230 in FIG. 6 are arranged in 1×2 matrix form.

Hereinafter, the two semiconductor chips included in the semiconductor chip module 230 are defined as a first semiconductor chip 210 and a second semiconductor chip 220.

The first semiconductor chip 210 includes a data storage (not shown), a data processor (not shown), and a first bonding pad group 215. Furthermore, the first semiconductor chip 210 may include a fuse box 216 having fuses (not shown) for repairing the data storage.

The first bonding pad group 215 includes a plurality of bonding pads, wherein the respective bonding pads are electrically connected to the data storage and the data processor. The bonding pads included in the first bonding pad group 215 are arranged along the Y-axis direction shown in FIG. 6. In FIG. 6 the bonding pads are formed in two columns.

Hereinafter, the plurality of bonding pads included in the first bonding pad group 215 are defined as a first bonding pad 211, a second bonding pad 212, a third bonding pad 214, and a fourth bonding pad 215. In the present embodiment, although the first bonding pad group 215 includes only four bonding pads, the first bonding pad group 215 may include more than four bonding pads.

The second semiconductor chip 220 includes a data storage (not shown), a data processor (not shown), and a second bonding pad group 225. Furthermore, the first semiconductor chip 210 may include a fuse box 216 having fuses (not shown) for repairing the data storage.

The second bonding pad group 225 includes a plurality of bonding pads, wherein the respective bonding pads are electrically connected to the data storage and the data processor. The bonding pads included are arranged along the Y-axis direction shown in FIG. 6. The bonding pads in FIG. 6 are formed in two columns.

Hereinafter, the bonding pads included in the second bonding pad group 225 are defined as a fifth bonding pad 221, a sixth bonding pad 222, a seventh bonding pad 224, and an eighth bonding pad 225. In the present embodiment, although the second bonding pad group 225 includes only four bonding pads, the second bonding pad group 225 may include more than four bonding pads.

In the present embodiment, the number of the bonding pads included in the first bonding pad group 215 is the same as the number of the bonding pads included in the second bonding pad group 225.

The same signal is input to the first bonding pad 211 included in the first bonding pad group 215 and the fifth bonding pad 221 included in the second bonding pad group 225 or, and the same signal is output from the first bonding pad 211 included in the first bonding pad group 215 and the fifth bonding pad 221 included in the second bonding pad group 225.

The same signal is input to the second bonding pad 212 included in the first bonding pad group 215 and the sixth bonding pad 222 included in the second bonding pad group 225, and the same signal is output from the second bonding pad 212 included in the first bonding pad group 215 and the sixth bonding pad 222 included in the second bonding pad group 225.

The same signal is input to the third bonding pad 213 included in the first bonding pad group 215 and the seventh bonding pad 223 included in the second bonding pad group 225, and the same signal is output from the third bonding pad 213 included in the first bonding pad group 215 and the seventh bonding pad 223 included in the second bonding pad group 225.

The same signal is input to the fourth bonding pad 214 included in the first bonding pad group 215 and the eighth bonding pad 224, included in the second bonding pad group 225 and the same signal is output from the fourth bonding pad 214 included in the first bonding pad group 215 and the eighth bonding pad 224 included in the second bonding pad group 225.

The semiconductor chip module 230 covers the fuse boxes 216 and 226 formed in the upper surfaces of the first semiconductor chip 210 and the second semiconductor chip 220. The semiconductor chip module 230 may include an organic pattern 217 having an opening exposing each of the bonding pads in the first and second bonding pad groups 215 and 225.

The connection member 270 electrically connects: the first bonding pad 211 included in the first bonding pad group 215 to the fifth bonding pad 221 included in the second bonding pad group 225; the second bonding pad 212 included in the first bonding pad group 215 to the sixth bonding pad 222 included in the second bonding pad group 225; the third bonding pad 213 included in the first bonding pad group 215 to the seventh bonding pad 223 included in the second bonding pad group 225; and the fourth bonding pad 214 included in the first bonding pad group 215 to the eighth bonding pad 221 included in the second bonding pad group 225.

To implement this, the connection member 270 includes a plurality of first re-distribution layers 272, a first insulation layer 274, a plurality of second re-distribution layers 276, a second insulation layer 278, and a plurality of pads 279.

The plurality of first re-distribution layers 272 are arranged on the organic layer pattern 217. Each side end of the respective first re-distribution layer 272 is individually connected to the respective first through eighth bonding pads 211, 212, 213, 214, 221, 222, 223, 224.

The first insulation layer 274 is formed on the organic layer pattern 217 to cover the first re-distribution layers 272. The first insulation layer 274 has a plurality of openings exposing a portion of the respective first re-distribution layer 272. The first insulation layer 274 prevents an electrical short between the first re-distribution layer 272 and a second re-distribution layer 276.

A plurality of second re-distribution layers 276 are arranged on the first insulation layer 274. Each second re-distribution layer 276 is electrically connected to the respective first re-distribution layer 272 exposed through the openings in the first insulation layer 274. The second re-distribution layers 276 may be formed such that they intersect the first re-distribution layers 272.

Referring to FIGS. 6 and 7, the first bonding pad 211 and the fifth bonding pad 221 are electrically connected to each other through the respective first and second re-distribution layers 272 and 276. The second bonding pad 212 and the sixth bonding pad 222 are electrically connected to each other through the respective first and second re-distribution layers 272 and 276. The third bonding pad 213 and the seventh bonding pad 223 are electrically connected to each other through the respective first and second re-distribution layer 272 and 276. And the fourth bonding pad 214 and the eighth bonding pad 224 are electrically connected to each other through the respective first and second re-distribution layers 272 and 276.

The second insulation layer 278 is arranged on the first insulation layer 274 to cover the second re-distribution layers, and the second insulation layer 278 has a plurality of openings exposing portions of the second re-distribution layer 276.

The pads 279 are arranged on the second insulation layer 278 in a matrix form, and are formed over openings in the second insulation layer. The pads 279 are formed according to the standards of the Joint Electron Device Engineering Council (JEDEC). A portion of the pad 279 is electrically connected to the respective second re-distribution layer 276 through the opening formed in the second insulation layer 278.

A solder ball 280 may be formed on each pad 279.

Figure 8:
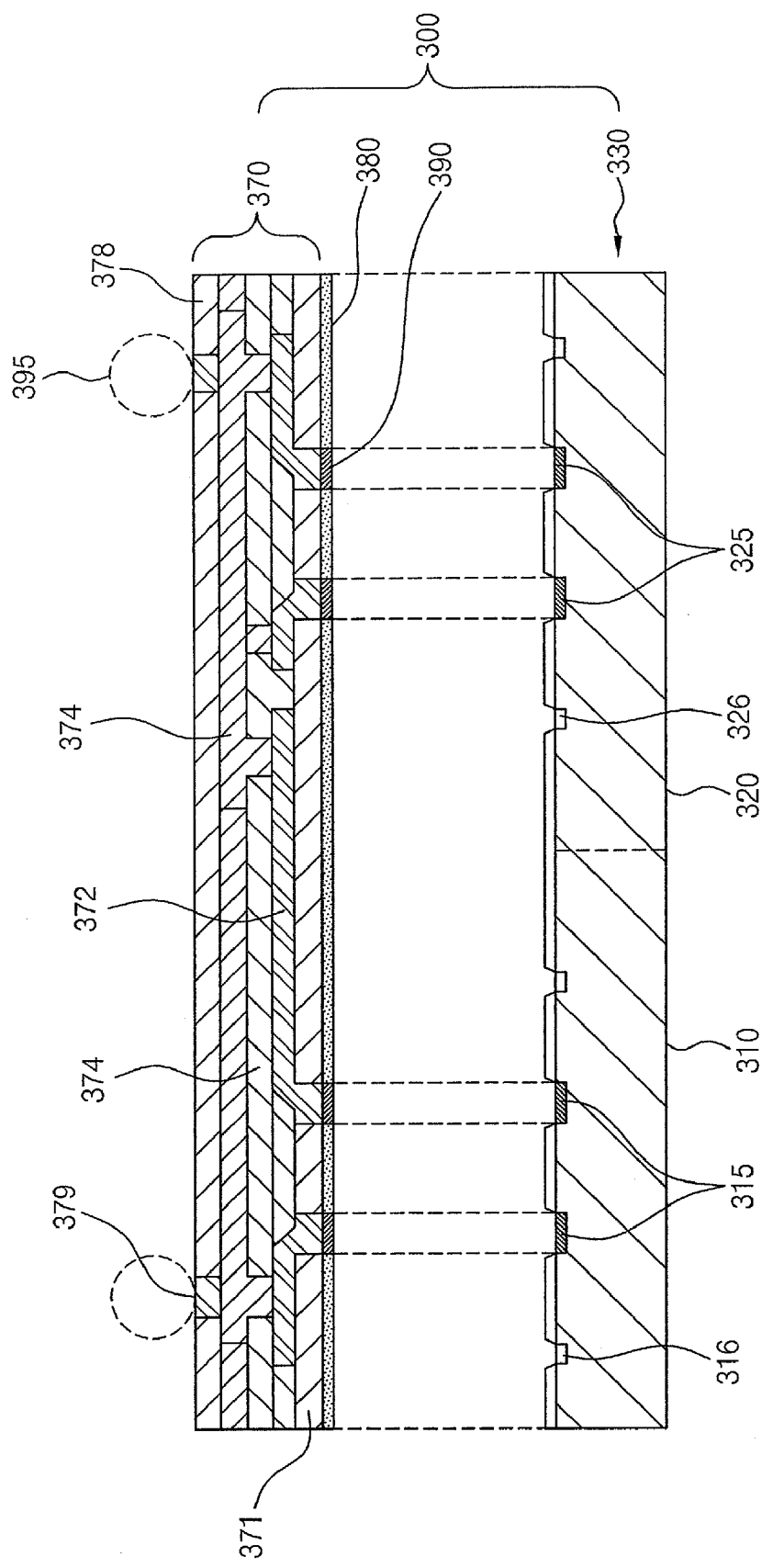
FIG. 8 is a cross-sectional view showing a semiconductor package according to a fourth embodiment of the present invention.
Figure 9:
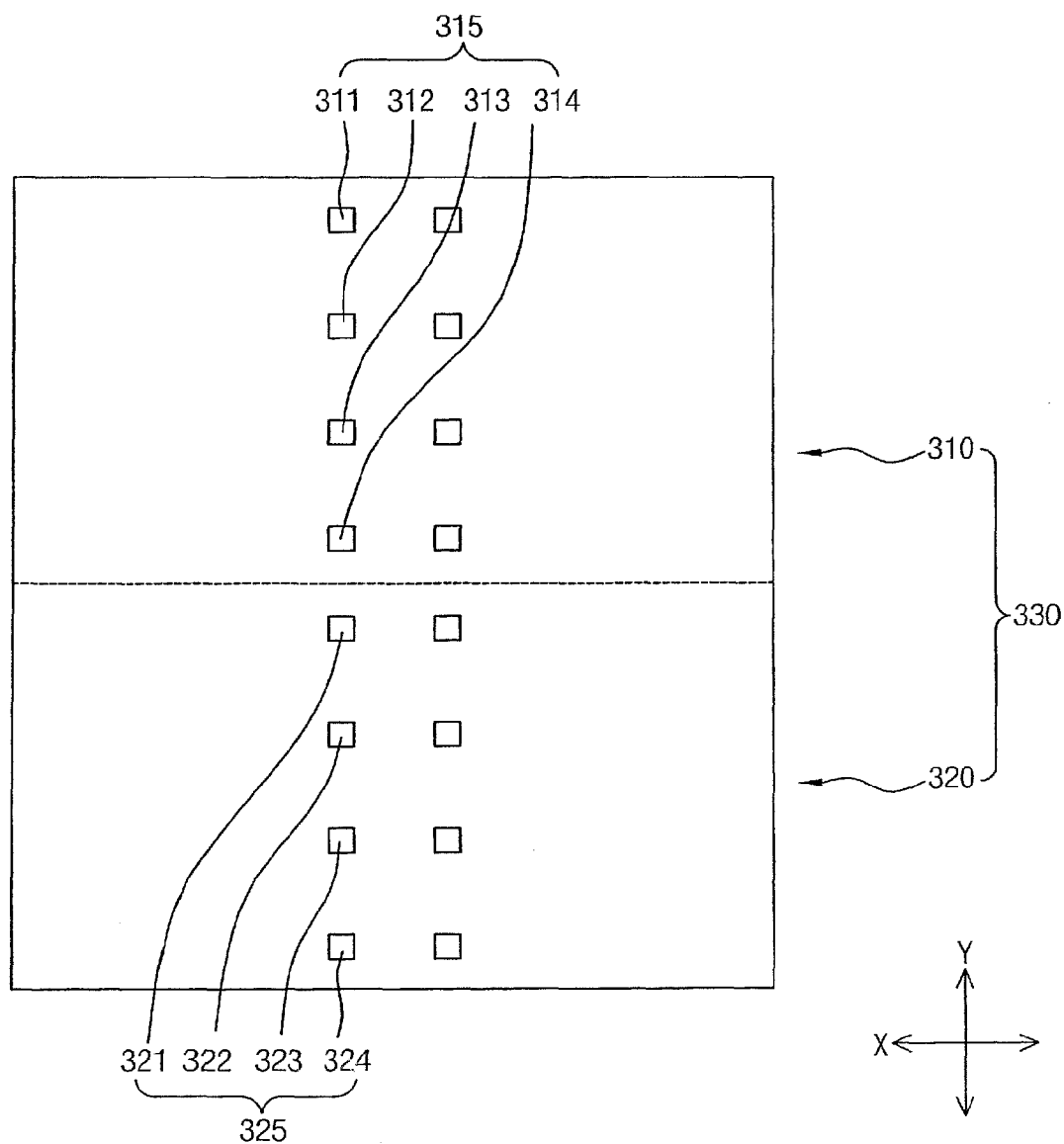
FIG. 9 is a plan view showing a semiconductor chip module of FIG. 8.
Figure 10:
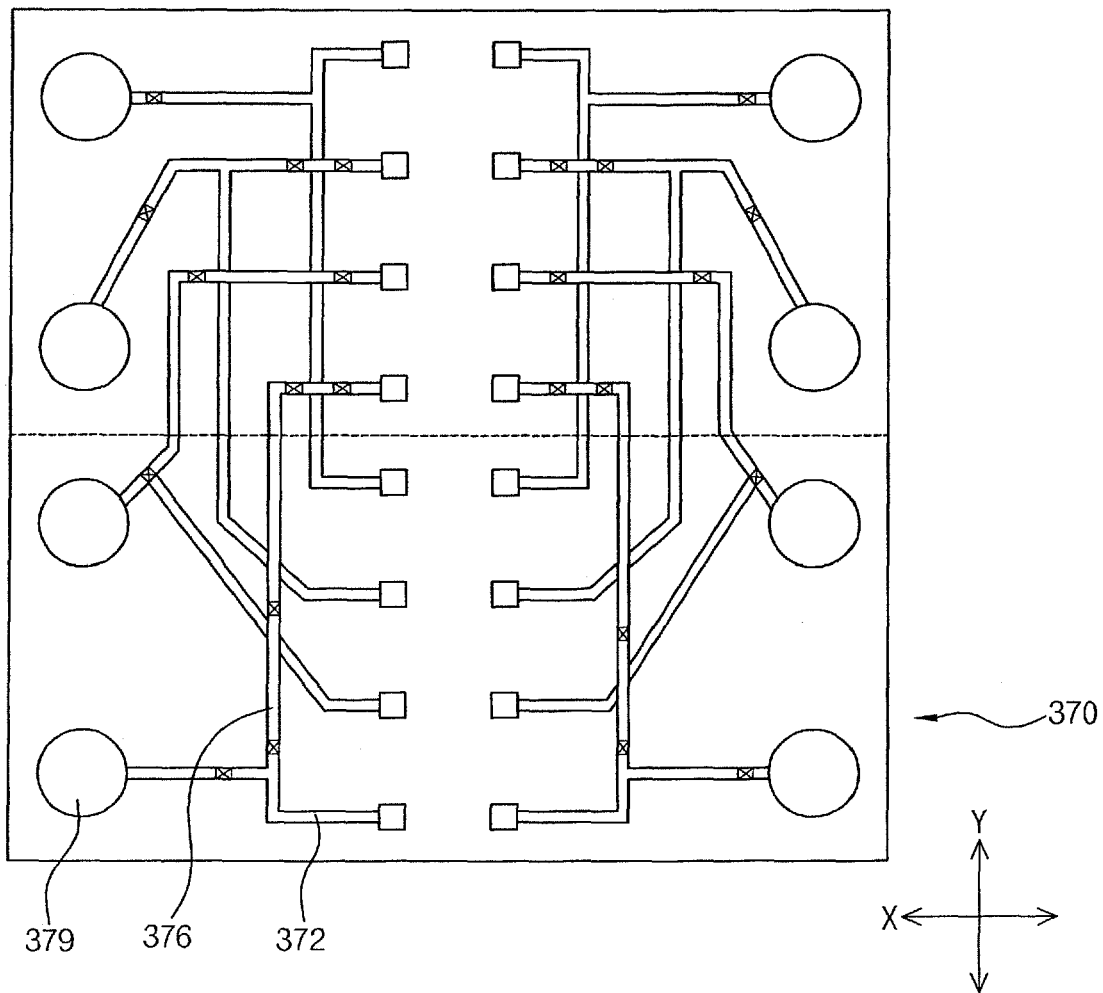
FIG. 10 is a plan view showing a re-distribution layer structure of FIG. 8.

FIG. 8 is a cross-sectional view showing a semiconductor package according to a fourth embodiment of the present invention. FIG. 9 is a plan view showing a semiconductor chip module included in the semiconductor package shown in FIG. 8. FIG. 10 is a plan view showing a re-distribution layer structure included in the semiconductor package shown in FIG. 8.

Referring to FIG. 8, the semiconductor package 300 includes a semiconductor chip module 330, a re-distribution layer structure 370, and an attachment member 380.

Referring to FIG. 9, the semiconductor chip module 330 may include a plurality of semiconductor chips. The semiconductor chips are arranged in an m×n matrix form, with m being 1 or more, n being 2 or more, and both m and n being natural numbers.

In the present embodiment the semiconductor chips of the semiconductor chip module 330 are integrally formed. FIG. 9 shows a first semiconductor chip 310 and a second semiconductor chip 320 that are integrally formed and arranged in a 1×2 matrix form. The first and second semiconductor chips 310 and 320 may be the same kind of semiconductor chip.

In the present embodiment, although the first semiconductor chip 310 and the second semiconductor chip 320 shown in FIG. 3 are integrally formed, the first semiconductor chip 310 and the second semiconductor chip 320 may also be arranged adjacent to each other in a separated state from each other. The separated first and second semiconductor chips 310 and 320 may be a different kind of semiconductor chip.

The first semiconductor chip 310 includes a data storage (not shown), a data processor (not shown), and a first bonding pad group 315.

The first bonding pad group 315 includes a plurality of bonding pads. Each bonding pads is electrically connected to the data storage and data processor.

The bonding pads included in the first bonding pad group 315 are arranged along the Y-axis direction shown in FIG. 9. The bonding pads in FIG. 9 are formed in two columns. Hereinafter, the plurality of bonding pads included in the first bonding pad group 315 are defined as a first bonding pad 311, a second bonding pad 312, a third bonding pad 313, and a fourth bonding pad 314. Although the first bonding pad group 315 in FIG. 9 includes only four bonding pads, the first bonding pad group 315 may include more than four bonding pads.

The second semiconductor chip 320 includes a data storage (not shown), a data processor (not shown), and a second bonding pad group 325.

The second bonding pad group 325 includes a plurality of bonding pads. Each bonding pads is electrically connected to the data storage and data processor.

The bonding pads are arranged along the Y-axis direction shown in FIG. 9. The bonding pads are formed in two columns. Hereinafter, the bonding pads included in the second bonding pad group 325 are defined as a fifth bonding pad 321, a sixth bonding pad 322, a seventh bonding pad 323, and an eighth bonding pad 324. Although the second bonding pad group 325 in FIG. 9 includes only four bonding pads, the second bonding pad group 325 may include more than four bonding pads.

The same signal is input to both the first bonding pad 311 included in the first bonding pad group 315 and the fifth bonding pad 321 included in the second bonding pad group 325, and the same signal is output from the first bonding pad 311 included in the first bonding pad group 315 and the fifth bonding pad 321 included in the second bonding pad group 325.

The same signal is input to the second bonding pad 312 included in the first bonding pad group 315 and the sixth bonding pad 322 included in the second bonding pad group 325, and the same signal is output from the second bonding pad 312 included in the second bonding pad group 315 and the sixth bonding pad 322 included in the second bonding pad group 325.

The same signal is input to the third bonding pad 313 included in the first bonding pad group 315 and the seventh bonding pad 322 included in the second bonding pad group 325, and the same signal is output from the third bonding pad 313 included in the first bonding pad group 315 and the seventh bonding pad 323 included in the second bonding pad group 325.

The same signal is input to the fourth bonding pad 314 included in the first bonding pad group 315 and the eighth bonding pad 324 included in the second bonding pad group 325, and the same signal is output from the fourth bonding pad 314 included in the first bonding pad group 315 and the eighth bonding pad 324 included in the second bonding pad group 325.

Referring to FIG. 8, the first and second semiconductor chips 310 and 320 may each include a fuse box 316 (in the first semiconductor chip) and 326 (in the second semiconductor chip) having fuses (not shown) for repairing the data storage.

The re-distribution layer structure 370 is formed over the semiconductor chip module 330 containing the first and second semiconductor chips 310 and 320. The re-distribution layer structure 370 is electrically connected to the semiconductor chip module 330 using an attachment member 380.

The re-distribution layer structure 370 electrically connects: the first bonding pad 311 included in the first bonding pad group 315 to the fifth bonding pad 321 included in the second bonding pad group 325; the second bonding pad 312 included in the first bonding pad group 315 to the sixth bonding pad 322 included in the second bonding pad group 325; the third bonding pad 313 included in the first bonding pad group 315 to the seventh bonding pad 323 included in the second bonding pad group 325; and the fourth bonding pad 314 included in the first bonding pad group 315 to the eighth bonding pad 324 included in the second bonding pad group 325.

Referring to FIGS. 8 and 10, the re-distribution layer structure 370 includes, a first insulation member 371, a plurality of first re-distribution layers 372, a second insulation member 374, a plurality of second re-distribution layers 376, a third insulation member 378, and a plurality of pads 379.

The first insulation member 371 may have a sheet form with a thin thickness. The first insulation member 371 may include synthetic resin. The first insulation member 371 covers a fuse box 316 arranged on the first semiconductor chip 310 and a fuse box 326 arranged on the second semiconductor chip 320 and has a plurality of openings exposing each bonding pad in the first and second bonding pad groups 315 and 325.

The first re-distribution layers 372 are formed on the first insulation member 371 and in the openings in the first insulation layer. The portions of the re-distribution layers formed in the openings of the first insulation layer are exposed. The first re-distribution layers 372 are electrically connected to each respective bonding pad in the first bonding pad group 315 and the second bonding pad group 325, as will be described subsequently.

In order to electrically connect the first re-distribution layers 372 to the first and second bonding pad groups 315 and 325, a conductive member 390 may be formed between the first re-distribution layers 372 and the first and second bonding pad groups 315 and 325. The conductive member 390 may be, for example, an anisotropic conductive film (ACF) including conductive balls having a fine diameter and resin. The conductive member 390 may also be solder including lead.

The second insulation member 374 is formed on the first insulation member 371 to cover the first re-distribution layers 372. In the present embodiment, the second insulation member 374 may have a sheet form with a thin thickness, and the second insulation member 371 may include synthetic resin. The second insulation member 374 has a plurality of openings exposing portions of the first re-distribution layers 372. The second insulation member 374 prevents an electrical short from occurring between the first re-distribution layers 372 and the second re-distribution layers 376.

A plurality of second re-distribution layers 376 are arranged on the second insulation member 374. The second re-distribution layers 376 are electrically connected to the respective first re-distribution layer 372 exposed through the opening formed in the second insulation member 374. The second re-distribution layers 376 may intersect the first re-distribution layers 372.

The third insulation member 378 is arranged on the second insulation member 374 to cover the second re-distribution layers 376. The third insulation member 378 has a plurality of openings exposing portions of the second re-distribution layers 376.

The pads 379 are arranged on the third insulation member 378 in a matrix form. The pads 379 are arranged to comply with the standards of the Joint Electron Device Engineering Council (JEDEC). A portion of each pad 379 is electrically connected to the respective second re-distribution layer 376 through the openings formed in the third insulation member 378. A solder ball 395 may be arranged on each pad 379.

In the foregoing description, the pads of the semiconductor package are formed to conform with the standards of the JEDEC. The integrally formed (or adjacently arranged) semiconductor chips with bonding pads having a size smaller than the standard of the JEDEC may be connected to the formed pads using re-distribution layers, making it possible to improve data integration and data processing speed while satisfying the standards of the JEDEC.

Although a plurality of specific embodiments of the present invention has been described for illustrative purposes, those skilled in the art will appreciate that various modifications, additions and substitutions are possible, without departing from the scope and the spirit of the invention as disclosed in the accompanying claims.

What is claimed is:
1. A semiconductor package comprising:
a semiconductor chip module including a first semiconductor chip and a second semiconductor chip, the first and second semiconductor chips being arranged adjacently;
a first bonding pad group having a plurality of bonding pads formed in the surface of the first semiconductor chip;

a second bonding pad group having a plurality of bonding pads formed in the surface of the second semiconductor chip;

a re-distribution layer structure including:

a first insulation member formed on the semiconductor chip module and having openings that expose each bonding pad in the first and second bonding pad groups;

a plurality of coplanar first re-distribution layers arranged on the first insulation member and electrically connecting each bonding pad in the first bonding pad group to the corresponding bonding pad in the second bonding pad group;

a second insulation member formed on the first insulation member to cover the first re-distribution layers, the second insulation member having a plurality of opening exposing a portion of the first re-distribution layers;

second re-distribution layers arranged on the second insulation member, and each second re-distribution layer being electrically connected to the corresponding first re-distribution layer;

a third insulation member formed over the second insulation member to cover the second re-distribution layers, the third insulation member having a second plurality of openings exposing the second re-distribution layer; and a plurality of pad parts, with each pad part being connected to the corresponding second re-distribution layers; and an attachment member attaching the re-distribution layer structure to the semiconductor chip module, wherein the second re-distribution layer electrically connected to the corresponding first re-distribution layer is disposed to extend from the first semiconductor chip to the second semiconductor chip and being connected to the respective pad parts of the first and the second re-distribution layers.

2. The semiconductor package according to claim 1, wherein the first semiconductor chip and the second semiconductor chip are formed integrally.

3. The semiconductor package according to claim 1, wherein the first semiconductor chip and the second semiconductor chip are separated from each other, the separated first and second semiconductor chips being arranged adjacently to each other.

4. The semiconductor package according to claim 1, wherein the bonding pads of the first bonding pad group are arranged in the same shape as the bonding pads in the second bonding pad group.

5. The semiconductor package according to claim 1, further comprising a conductive connection member interposed between the first re-distribution layers and the first and second bonding pads of the re-distribution layer structure of the semiconductor package.

6. The semiconductor package according to claim 5, wherein the conductive connection member is an anisotropic conductive film including a conductive ball and resin.

7. The semiconductor package according to claim 5, wherein the conductive connection member includes solder.

8. The semiconductor package according to claim 1, wherein each pad part is electrically connected to a solder balls.

9. The semiconductor package according to claim 1, wherein the first, second and third insulation members include synthetic resin and have a sheet form.

* * * * *